(12) United States Patent
Ma et al.

(10) Patent No.: US 6,219,243 B1
(45) Date of Patent: *Apr. 17, 2001

(54) HEAT SPREADER STRUCTURES FOR ENHANCED HEAT REMOVAL FROM BOTH SIDES OF CHIP-ON-FLEX PACKAGED UNITS

(75) Inventors: Qing Ma, San Jose; Lise Varner, Palo Alto; Harry Fujimoto, Sunnyvale, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/461,469

(22) Filed: Dec. 14, 1999

(51) Int. Cl.[7] ....................................................... H05K 7/20
(52) U.S. Cl. ............................ 361/704; 361/715; 361/719; 361/749; 257/713; 257/717; 257/706
(58) Field of Search ..................................... 361/688, 689, 361/690, 699, 700, 702–704, 707, 713, 717–719, 760–762; 257/695, 706, 707, 712–715, 717, 720, 722; 174/15.1, 15.2, 16.3; 165/80.2, 80.3, 104.33, 185

(56) References Cited

U.S. PATENT DOCUMENTS

| | | | |
|---|---|---|---|
| 5,155,661 | * 10/1992 | Nagesh et al. | 361/715 |
| 5,367,193 | * 11/1994 | Malladi | 257/707 |
| 5,621,615 | * 4/1997 | Dawson et al. | 361/704 |
| 5,625,227 | * 4/1997 | Estes et al. | 361/699 |
| 5,734,555 | * 3/1998 | McMahon | 361/704 |
| 5,751,063 | * 5/1998 | Baba | 257/753 |
| 5,960,535 | * 10/1999 | Rubens et al. | 361/719 |
| 5,990,550 | * 11/1999 | Umezawa | 257/712 |

* cited by examiner

Primary Examiner—Leo P. Picard
Assistant Examiner—Boris L. Chervinsky
(74) Attorney, Agent, or Firm—Scwegman Lundberg Woessner & Kluth, P.A.

(57) ABSTRACT

An enhanced heat dissipation device for a chip-on-flex packaged unit includes a flex circuit material attached to a front side of an integrated circuit die. The flex circuit material further attached to a bottom side of a printed circuit board having an opening to expose the flex circuit material. A top heat spreader thermally coupled to the flex circuit material through the opening in the printed circuit to dissipate heat from the front side of the integrated circuit die. The device further includes a bottom heat spreader, that is thermally coupled to back side of the integrated circuit die, to dissipate heat from the back side of the integrated circuit die. This enables the heat dissipation device to dissipate heat from both the front side and back side of the integrated circuit die, and thereby enhancing the heat dissipation for a given unit surface are of the integrated circuit die without increasing the volume of the heat dissipation device.

30 Claims, 6 Drawing Sheets

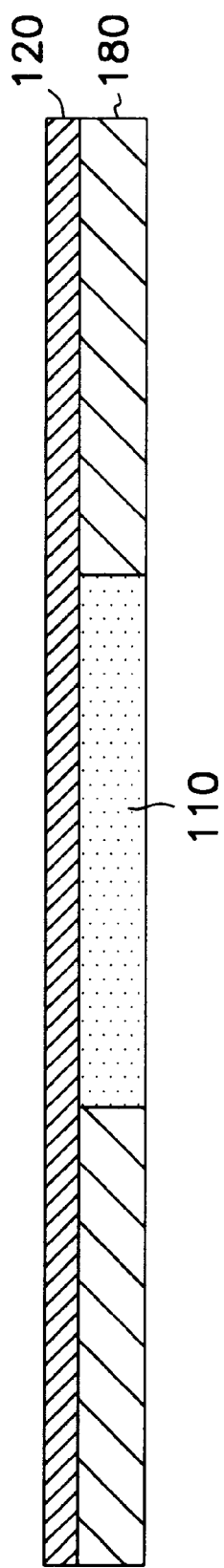
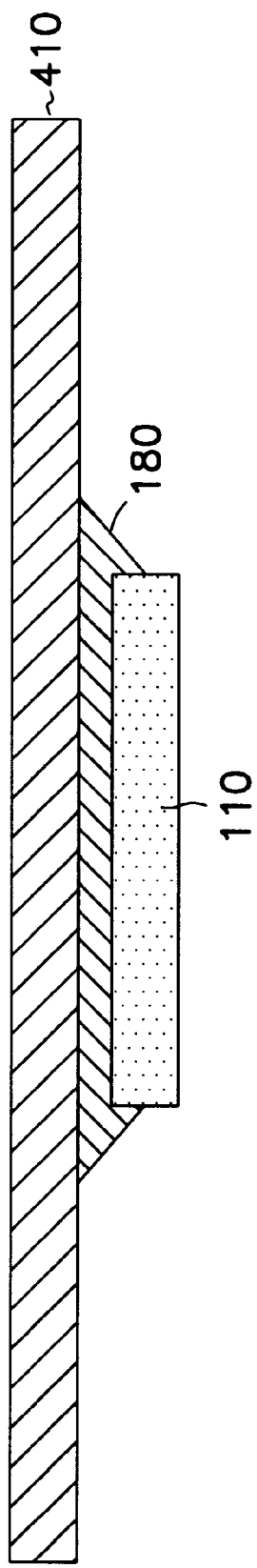

HEAT SPREADER STRUCTURES FOR ENHANCED HEAT REMOVAL FROM BOTH SIDES OF CHIP-ON-FLEX PACKAGED UNITS

TECHNICAL FIELD

This invention relates generally to a heat dissipation device for an integrated circuit assembly, and more particularly to a heat dissipation device for a chip-on-flex packaged unit.

BACKGROUND

Microprocessors and other related computer components are becoming more and more powerful with increasing capabilities, resulting in increasing amounts of heat generated from these components. Packaged units and integrated circuit die sizes of these components are decreasing or remaining the same, which increases the amount of heat energy given off by the components for a given unit of surface area. Furthermore, as computer related equipment becomes more powerful, more and more components are being placed inside the equipment which is also decreasing in size, resulting in additional heat generation in a smaller volume of space. Increased temperatures can potentially damage the components of the equipment, or reduce the lifetime of the individual components and the equipment. Generally the performance of these components go down with the increase in temperature. Therefore, large amounts of heat produced by many such integrated circuits must be dissipated, and therefore must be accounted for in designing the integrated circuit mounting and packaging devices.

In current packaging techniques, heat sinks are often applied to the side of the integrated circuit opposite the side from which the electrical pin connections are mounted. As such, the heat sink is oriented extending away from a printed circuit board to which the integrated circuit is mounted. Therefore, the heat dissipation can be accomplished from only one side (back side) of the integrated circuit die. Further, the overall size of a heat sink is basically limited by the volume constraints of the housing.

For the reasons stated above and for other reasons explained below, there is a need for an enhanced heat dissipation device for integrated circuit devices.

SUMMARY

The above-mentioned shortcomings, disadvantages and problems are addressed by the present invention, which will be understood by reading and studying the following specification. The present invention provides, among other things, an enhanced heat dissipation device.

According to one aspect of the present subject matter, a heat dissipation device includes a flex circuit material attached to a front side of an integrated circuit die, and the flex circuit material is further attached to a bottom of a printed circuit board. The printed circuit board further defines an opening that exposes the flex circuit material. The heat dissipation device further includes a top heat spreader thermally coupled to the flex circuit material through the opening to dissipate heat from the front side of the integrated circuit die. In one embodiment, the heat dissipation device includes a bottom heat spreader thermally coupled to back side of the integrated circuit die to dissipate heat from the back side of the integrated circuit die. This embodiment enables the heat dissipation device to dissipate heat from both sides of the integrated circuit die. In another embodiment, heat sinks are further mounted to the top and bottom heat spreaders for more efficient heat removal from the top and bottom heat spreaders.

In another embodiment, the printed circuit board has two additional openings, wherein the top heat spreader further passes through the printed circuit board such that the heat generated from the front side of integrated circuit die can be transported to the bottom of the printed circuit board. This embodiment enables the heat dissipation device to dissipate heat from both sides of the integrated circuit die to the bottom of the circuit board, and thereby eliminating the need for mounting two separate heat sinks. This embodiment considerably reduces the volume of space required by the heat dissipation device for a given unit of surface area of the integrated circuit die.

In another embodiment, thermal vias are included in the flex circuit material to enhance the heat dissipation from the front side of the integrated circuit die to the top heat spreader.

Other aspects of the invention will be apparent on reading the following detailed description of the invention and viewing the drawings that form a part thereof.

BRIEF DESCRIPTION OF THE DRAWINGS

In the drawings, like numerals describe substantially similar components throughout the several views. Like numerals having different letter suffixes represent different instances of substantially similar components.

FIG. 4A is a sectional view of one embodiment of the chip-on-flex packaged unit.

FIG. 4B is a sectional view of one embodiment of the chip-on-board (current packaging technique shown for clarity only, and also to compare and contrast with the chip-on-flex packaged unit used in the present invention) packaged unit.

DETAILED DESCRIPTION

Figure 1:
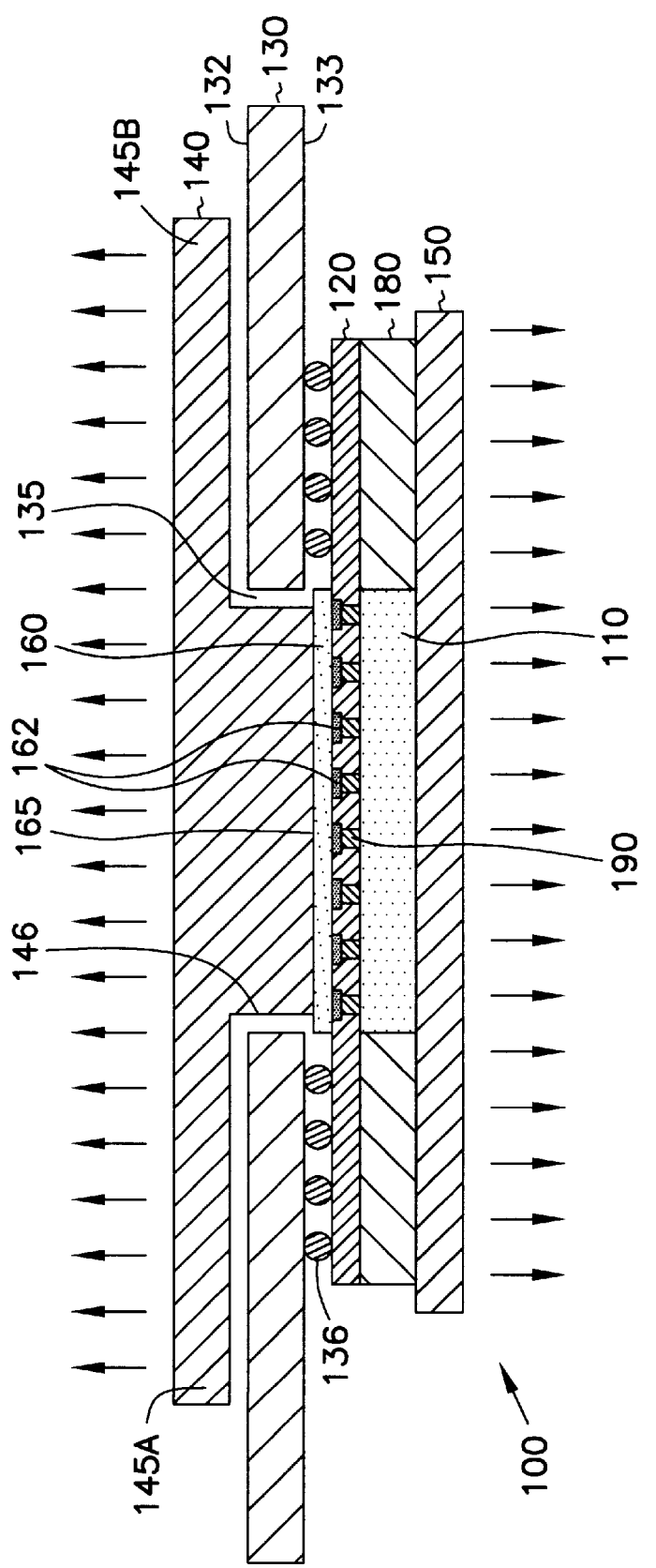
FIG. 1 is a sectional view of one embodiment of the present invention, showing generally the packaging technique of heat dissipation device to the chip-on-flex packaged unit.

In the following detailed description, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description is, therefore, not to be taken in a limiting sense, and the scope of the present invention is defined by the appended claims and their equivalents. In the drawings, like numerals describe substantially similar components throughout the several views. Like numerals having different suffixes represent different instances of substantially similar components.

In this document the term chip-on-flex is understood to refer to an integrated circuit assembly packaged unit including a bare integrated circuit die directly attached to a flexible circuit material using materials such as molding compound, epoxy or some other similar material. Similarly, the term chip-on-board is understood to refer to an integrated circuit assembly packaged unit including an integrated circuit die directly attached to a circuit board using materials such as molding compound, epoxy or some other similar material. Also in this document the terms integrated circuit die and semiconductor die are used interchangeably throughout the document.

This document describes, among other things, an enhanced heat dissipation device for a chip-on-flex packaged unit. This is accomplished in one embodiment by mounting a flex circuit material to a front side of an integrated circuit die, and further mounting the flex circuit material to a bottom of a printed circuit board. The printed circuit board has an opening that exposes the flex circuit material. A top heat spreader is thermally coupled to the flex circuit material through the opening, to dissipate heat from the front side of the integrated circuit die. Further, the heat dissipation device includes a bottom heat spreader that is thermally coupled to a back side of the integrated circuit die to dissipate heat from back side of the integrated circuit die. This enables the heat dissipation device to dissipate heat from both sides of the integrated circuit die. In one embodiment explained below, the heat dissipation device further includes heat sinks mounted to top and bottom heat spreaders for more efficient heat removal from the top and bottom heat spreaders.

FIG. 1 is a sectional view illustrating generally, by way of example, but not by way of limitation, one embodiment of a packaging heat dissipation device of the present subject matter to a chip-on-flex packaged unit 100. Flex circuit material 120 is attached to a front side of an integrated circuit die 110 using a molding compound, epoxy or other similar material 180. Further, the flex circuit material 120 is attached to a bottom side 133 of a printed circuit board 130 having an opening 135 to expose the portion of the flex circuit material including the integrated circuit die 110. In one embodiment the printed circuit board 130 is attached to electrical pads of the flex circuit material 120 using solder 136 or other such conductive materials.

Flex circuit material 120 can be made from polyimide based material such as Kapton or other such equivalent die electric materials. The thickness of the flex circuit material 120 is generally around 100 microns (0.1 millimeter), whereas the thickness of a circuit board used in the current packaging technology is around 1000 microns (1 millimeter). The flex circuit material 120 used in the present subject matter is considerably thin when compared to the thickness of the printed circuit board material used in the current packaging technology. Because the flex circuit material 120 is thin, it is possible for the present invention to dissipate heat from the front side of the integrated circuit die 110 through the flex circuit material 120. Technology using a chip-on-board packaging unit limits the heat dissipation to only one side (back side) of the integrated circuit die 110. That is, the thickness of the circuit board makes it difficult to conduct heat through the circuit board.

In one embodiment, dummy thermal vias 190 are provided in the flex circuit material 120 to further enhance the heat dissipation through the flex circuit material 120 to the top heat spreader 140. The density of the thermal vias can range from 5 to 50 vias/mm$^2$. A process for including the thermal vias can be same as used for electrical vias. In one embodiment thermal vias are connected to dummy pads 162 as opposed to generally connecting electrical vias to electrical pads.

FIG. 1 also shows a top heat spreader 140 thermally coupled to the flex circuit material 120 at contact area 165 through the opening 135 in the printed circuit board 130. In one embodiment the top heat spreader 140 has an upwardly extending contact region 146 extending upwardly from the contact area 165 and passes through the opening 135 of the printed circuit board 130. In one embodiment the top heat spreader 140 includes a laterally extending heat dissipation regions 145A and 145B. The laterally extending heat dissipation regions 145A and 145B extend laterally in opposite directions from the upwardly extending contact region 146. In one embodiment, the opening 135 has enough clearance for the upwardly extending contact region 146 to pass through without interfering with the printed circuit board 130. In one embodiment there is enough clearance between the laterally extending heat dissipation regions 145A and 145B, and the top side 132 of the printed circuit board 130 such that the laterally extending dissipation regions 145A and 145B does not interfere with the top side 132 of the printed circuit board 130. In one embodiment, a layer of thermal grease 160 is disposed between the top heat spreader 140 and the flex circuit material 120 to efficiently conduct heat from the flex circuit material 120 to the top heat spreader 140. FIG. 1, further shows a bottom heat spreader 150 thermally coupled to a back side of the integrated circuit die 110 to remove heat from the back side of the integrated circuit die 110. In one embodiment, the bottom heat spreader 150 is thermally coupled to the back side of the integrated circuit die 110 using a thin layer of thermally conductive adhesive (not shown for clarity). This configuration enables the heat generated by the integrated circuit die 110 to be dissipated from both the front side and back side of the integrated circuit die 110, thereby enhancing the dissipation of heat generated by the integrated circuit die 110 for a given volume of the heat dissipation device 100.

Figure 2:
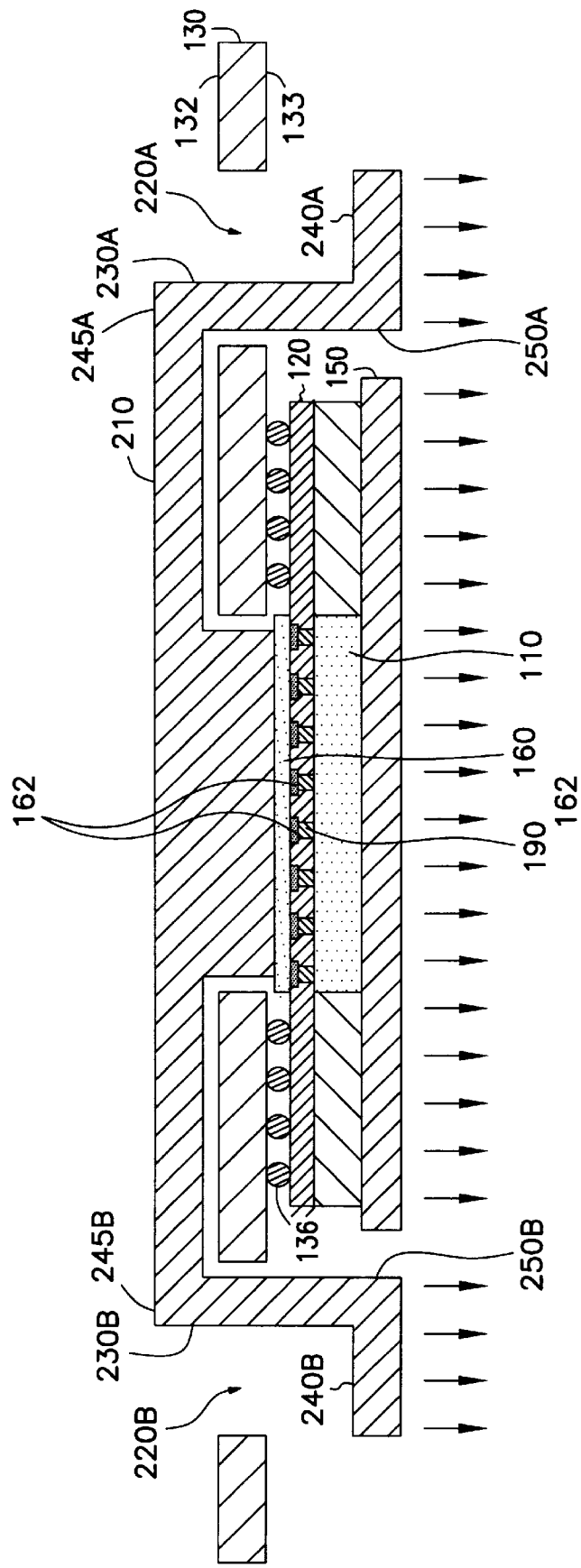
FIG. 2 is a sectional view of another embodiment of the present invention, showing generally the packaging technique of heat dissipation device to the chip-on-flex packaged unit.

FIG. 2 is a sectional view, similar to FIG. 1, illustrating generally, by way of example, but not by way of limitation, another embodiment of the top heat spreader 210, wherein the top heat spreader 210 further passes through openings 220A and 220B in the printed circuit board 130. In addition to what is shown in FIG. 1, in one embodiment the top heat spreader 210 has a downwardly extending legs 230A and 230B, disposed across from each other and extending outwardly from the laterally extending heat dissipation regions 245A and 245B. In one embodiment, feet 240A and 240B extend in opposite directions from each other and are attached to bottom regions 250A and 250B of the downwardly extending legs 230A and 230B. In one embodiment the openings 220A and 220B are large enough for the feet 240A and 240B to pass through the printed circuit board 130 without interfering with the printed circuit board 130. This embodiment enables the top heat spreader to dissipate heat to a bottom side 133 of the printed circuit board 130, as opposed to being limited to dissipating the heat from only the top of the printed circuit board 130 as shown in the embodiment of FIG. 1. Also this embodiment enables the heat from both the front side and back side of the integrated circuit die 110 to be dissipated from one side (bottom side 133) of the of the printed circuit board 130.

Figure 3:
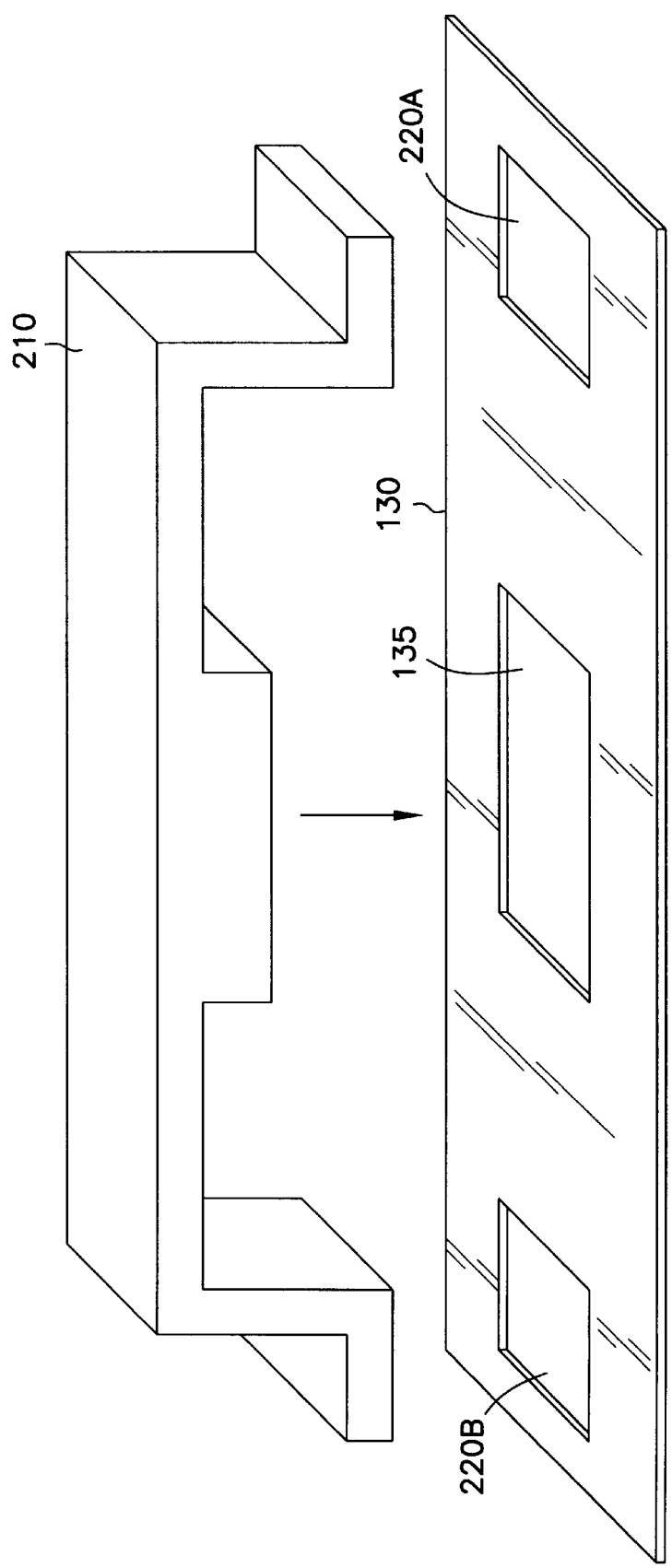
FIG. 3 is an exploded view of one embodiment of the present invention, showing generally the printed circuit board including the openings and its packaging relationship with the top heat spreader.

FIG. 3 is an exploded view, illustrating generally, by way of example, but not by way of limitation, one embodiment of a top heat spreader 210 and its alignment with a printed circuit board 130 having openings 135 and 220 A–B. In one embodiment the opening 135 is large enough for the upwardly extending contact region 146 of the top heat spreader 210 to pass through the printed circuit board 130 without interfering with the printed circuit board 130. In one embodiment the openings 220A and 220B are large enough for the feet 240A and 240B to pass through the printed circuit board 130 without interfering with the printed circuit board 130.

FIG. 4A is a sectional view, illustrating generally, by way of example, but not by way of limitation, one embodiment of chip-on-flex packaged unit. An integrated circuit die 110 attached to a flex circuit material 120 using a molding compound, epoxy or other similar material 180. Flex circuit material is generally made from Kapton or other equivalent materials. Generally the thickness of the flex material is around 100 microns (0.1 millimeter).

FIG. 4B is a sectional view, illustrating generally, by way of example, one embodiment of currently used chip-on-board packaging technology for building microprocessors. FIG. 4B is included herein to show the difference in the thickness of the substrate used in the current packaging technology (chip-on-board) with the substrate used in the chip-on-flex packaging technology of the present invention. FIG. 4B shows an integrated circuit die 110 attached directly to a circuit board 410 made from glass epoxy, FR-4 or other similar materials. The integrated circuit die 110 is directly attached to the printed circuit board 410 using a molding compound 180. Generally the thickness of the circuit board 410 is around 1000 microns (1 millimeter). This is nearly ten times thicker than the thickness of the flex material 120 used in the present invention. Because, the flex circuit material 120 is only 100 microns, it is possible to conduct heat through the flex circuit material and into the top heat spreader 140.

Figure 5:
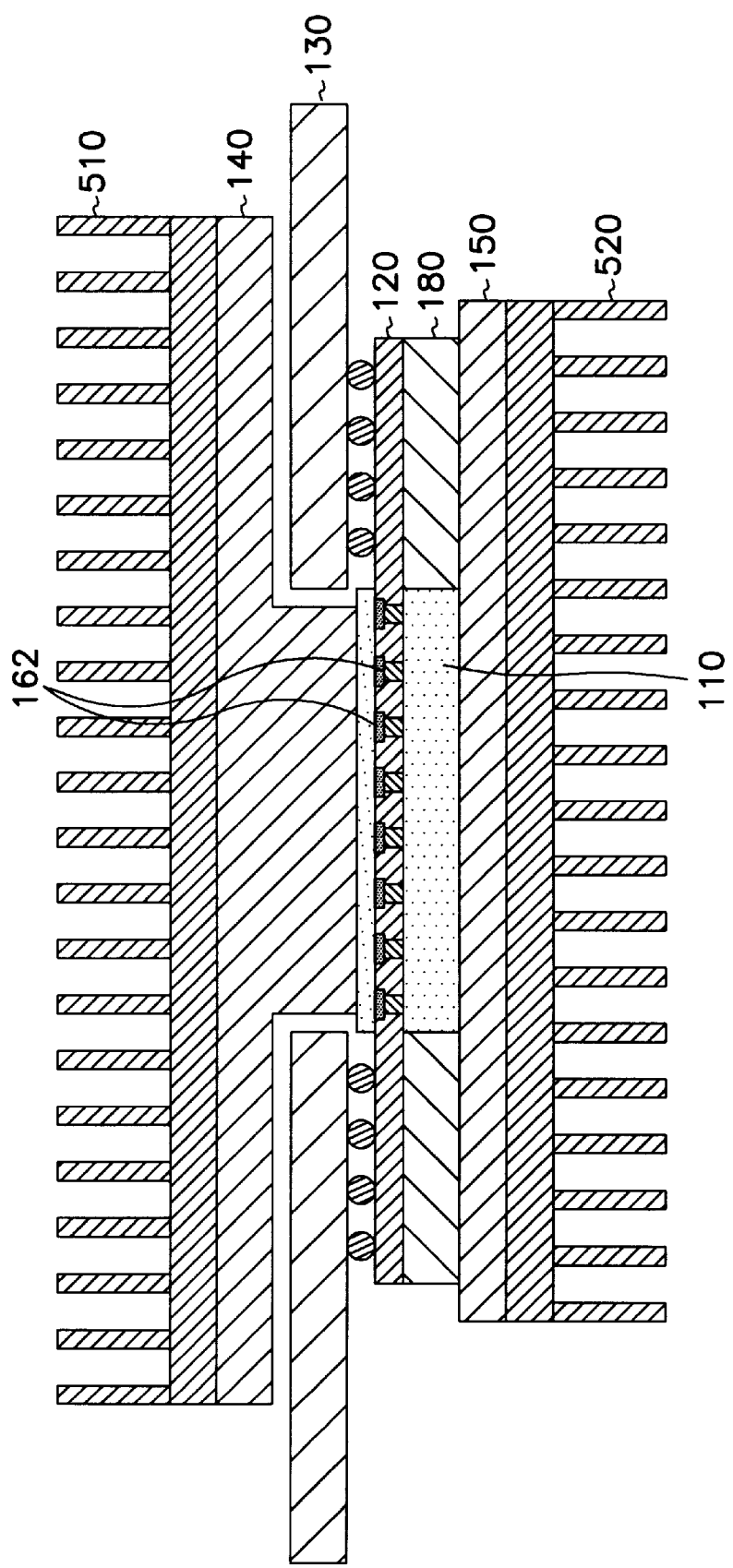
FIG. 5 is a sectional view of one embodiment of the present invention, showing generally the mounting of heat sinks to the heat dissipation device.

FIG. 5 is a sectional view, similar to FIG. 1, showing generally, by way of example, but not by way of limitation, one embodiment of mounting heat sinks to efficiently dissipate heat from heat spreaders. In addition to what is shown in FIG. 1, FIG. 5 shows a top heat sink 510 thermally coupled to top heat spreader 140 to dissipate heat away from the top heat spreader 140, and a bottom heat sink 520 thermally coupled to bottom heat spreader 150 to dissipate heat away from the bottom heat spreader 150. In one embodiment, the top heat spreader 140 and the bottom heat spreader 150 are made from material such as copper, which is a very good conductor of heat. Other conductive materials however, could be used without departing from the present invention.

Figure 6:
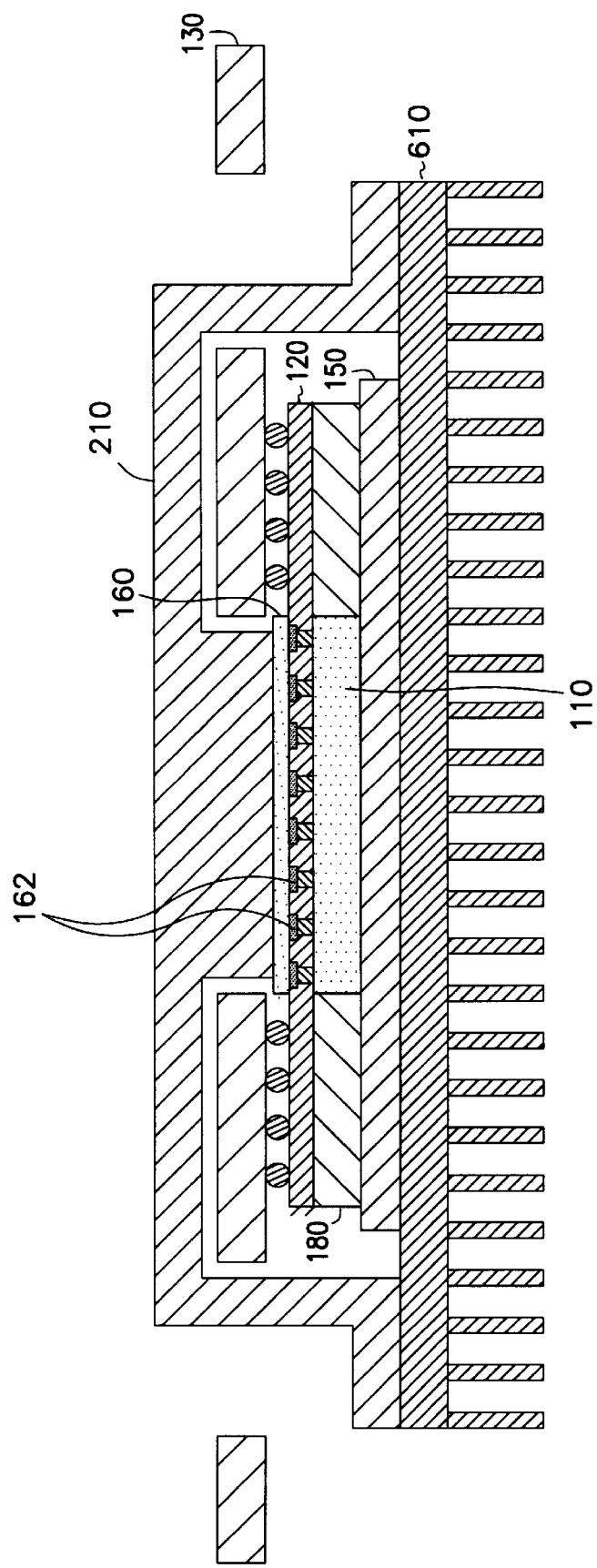
FIG. 6 is a sectional view of another embodiment of the present invention showing generally mounting of a heat sink to the heat dissipation device.

FIG. 6 is a sectional view, similar to FIG. 2, showing generally, by way of example, but not by way of limitation, another embodiment of using a heat sink to dissipate heat from heat spreaders. In addition to what is shown in FIG. 2, FIG. 6 illustrates a heat sink 610 that is thermally coupled to both top heat spreader 210 and bottom heat spreader 150. This embodiment enables the use of only one heat sink 610 to dissipate heat from both the top heat spreader 210 and the bottom heat spreader 150, and thereby eliminates the need for mounting two separate heat sinks. In one embodiment the top heat spreader 210 is made from a material such as Thermacore (heat pipe made by Thermacore Inc. Lancaster, Pa.) to transport the heat generated from the front side of the integrated circuit die 110 to the bottom of the circuit board 130. In one embodiment the heat pipe can include an internal chamber. In one embodiment, the chamber includes a void that is partially filled with a small quantity of fluid. In one embodiment, the fluid is water. At the thermal interface with the circuit die/flex material, thermal energy is transferred to the surface of the spreader. The thermal energy excites the fluid. Such excitation transforms a portion of the fluid from a liquid state to a gaseous state. The gaseous fluid raises to the top of the chamber. The gaseous fluid shifts back to a liquid state and condenses at the top of the chamber. The thermal energy in the liquid fluid is transferred to the top chamber surface. The liquid fluid then travels back to the bottom of the chamber where it rejoins the aqueous solution. This is one example of the heat pipe that can be used with the present invention. Bottom heat spreader 150 is generally made from materials such as copper or other such thermally conductive materials. This is one example of a heat spreader that can be used with the present invention.

CONCLUSION

The above-described device provides, among other things, an enhanced heat dissipation from chip-on-flex packaged units. The heat dissipation is accomplished by mounting a flex circuit material to a front side of an integrated circuit die, and by thermally coupling a heat spreader to the flex circuit material to dissipate heat from the front side of the integrated circuit die. The device can further include a bottom heat spreader thermally coupled to a back side of the integrated circuit die to dissipate heat from the back side of the integrated circuit die. This enables heat generated from the integrated circuit die to be dissipated from both the front side and the back side of the integrated circuit die, and thereby significantly enhancing the heat dissipation for a given unit of surface area the integrated circuit die without increasing the volume of the heat dissipation device. The flex material can be accessed through an opening in a circuit board coupled to the flex circuit material.

It is understood that the above description is intended to be illustrative, and not restrictive. Many other embodiments will be apparent to those of skill in the art upon reviewing the above description. This application is intended to cover any adaptations or variations of the present invention. The scope of the invention includes any other applications in which the above structures and fabrication methods are used. Accordingly, the scope of the invention should, therefore, be determined with reference to the appended claims, along with the full scope of equivalents to which such claims are entitled.

What is claimed is:

1. A heat dissipation device, comprising:
    an integrated circuit die, wherein the integrated circuit die has a front side including electrical pin connections;
    a flex circuit material attached to the front side of the integrated circuit die;
    a circuit board attached to the flex circuit material such that the flex circuit material is disposed between the front side of the integrated circuit die and the circuit board, wherein the circuit board comprising an opening to expose a portion of the flex circuit material located over the front side of the integrated circuit die; and
    a top heat spreader thermally coupled to the flex circuit material through the opening in the circuit board such that the top heat spreader extracts heat away from the integrated circuit die substantially through the flex circuit material.

2. The heat dissipation device of claim 1, further comprising a bottom heat spreader thermally coupled to the integrated circuit die, and located on an opposite side of the circuit board from the top heat spreader.

3. The heat dissipation device of claim 2, further comprising a thermally conductive interface material between the flex circuit material and the top heat spreader.

4. The heat dissipation device of claim 3, wherein the thermally conductive interface material includes a layer of thermal grease.

5. The heat dissipation device of claim 3, wherein the thermally conductive interface material includes a layer of thermally conductive adhesive.

6. The heat dissipation device of claim 3, further comprising a thermally conductive interface material between the integrated circuit die and the bottom heat spreader.

7. The heat dissipation device of claim 6, wherein the thermally conductive interface material includes a layer of thermally conductive adhesive.

8. The heat dissipation device of claim 6, further comprising a top heat sink mounted to the top heat spreader, and a bottom heat sink mounted to the bottom heat spreader.

9. The heat dissipation device of claim 1, wherein the flex circuit material further includes thermal vias connected to dummy pads to conduct heat to the top heat spreader.

10. The heat dissipation device of claim 9, wherein the density of thermal vias is greater than or equal to 5 vias/mm$^2$ and less than or equal to 50 vias/mm$^2$.

11. The heat dissipation device of claim 1, wherein the integrated circuit die is a microprocessor.

12. The heat dissipation device of claim 1, wherein the circuit board further comprises second and third openings located on opposite sides of the first opening.

13. The heat dissipation device of claim 12, wherein the top heat spreader further passes through the second and third openings.

14. The heat dissipation device of claim 13, further including a bottom heat spreader thermally coupled to the integrated circuit die and located on an opposite side of the circuit board from the top heat spreader.

15. The heat dissipation device of claim 14, further includes a heat sink attached to both the top and bottom heat spreaders.

16. A heat dissipation device, comprising:
   an integrated circuit die having a front side and a opposite back side;
   a flex circuit material attached to the front side of the integrated circuit die;
   a circuit board having a bottom side and a opposite top side, the bottom side of the circuit board attached to the flex circuit material such that the flex circuit material is located between the integrated circuit die and the bottom side of the circuit board, wherein the circuit board comprises a first opening, a second opening, and a third opening, wherein the first opening exposes a portion of the flex circuit material located adjacent to the front side of the integrated circuit die;
   a top heat spreader located above the circuit board, wherein the top heat spreader comprises first, second and third vertically extending portions passing respectively through the first, second and third openings of the circuit board, wherein the first portion is thermally coupled to the flex circuit material through the first opening; and
   a bottom heat spreader thermally coupled to the back side of the integrated circuit die and disposed opposite side of the top heat spreader.

17. The heat dissipation device of claim 16, further comprising a heat sink mounted to the top and bottom heat spreaders, wherein the heat sink is disposed on the bottom side of the printed circuit board.

18. A heat spreader assembly for a chip-on-flex packaged unit, comprising:
   a semiconductor die, wherein the semiconductor die has a front side, the front side including electrical pin connections, wherein the front side of the semiconductor die is attached to a flex circuit material;
   a circuit board attached to the flex circuit material such that the flex circuit material is located between the front side of the die and the circuit board, the circuit board comprises an opening to expose a portion of the flex circuit material located adjacent to the front side of the integrated circuit die; and
   a top heat spreader thermally coupled to the flex circuit material through the opening in the circuit board such that the top heat spreader extracts heat away from the integrated circuit die substantially through the flex circuit material.

19. The heat spreader assembly of claim 18, further comprising a bottom heat spreader thermally coupled directly to the semiconductor die.

20. The heat spreader assembly of claim 19, further comprising a top heat sink mounted to the top heat spreader, and a bottom heat sink mounted to the bottom heat spreader.

21. A method of packaging a chip-on-flex packaged unit for enhanced heat removal from a front side of an integrated circuit die, the method comprising:
   attaching a flex circuit material to the front side of the integrated circuit die having electrical pin connections;
   attaching the flex circuit material to a bottom side of a circuit board having an opening to expose the flex circuit material; and
   mounting a top heat spreader to the flex circuit material through the opening in the circuit board such that the top heat spreader is thermally coupled to the flex circuit material to extract the heat away from the front side of the integrated circuit die substantially through the flex circuit material.

22. The method of claim 21, wherein mounting the top heat spreader includes applying a layer of thermal grease between the flex circuit material and the top heat spreader.

23. The method of claim 21, further comprising thermally coupling a top heat sink to the top heat spreader.

24. The method of claim 21, further comprising mounting a bottom heat spreader directly to the integrated circuit die.

25. The method of claim 21, mounting the bottom heat spreader includes applying a layer of thermal adhesive between the integrated circuit die and the bottom heat spreader.

26. The method of claim 25, further comprising mounting a bottom heat sink to the bottom heat spreader.

27. A method, comprising:
   mounting a flex circuit material on an integrated circuit die;
   mounting the flex circuit material to a bottom side of a circuit board having a first, second and a third opening, wherein the flex circuit material is exposed through the first opening; and
   mounting a top heat spreader through the first opening to the flex circuit material, wherein the top heat spreader further passes vertically through the second and third openings.

28. The method of claim 27, further comprising mounting a bottom heat spreader directly to the integrated circuit die.

29. The method of claim 27, further comprising mounting a heat sink to both the top and bottom heat spreaders, such that the heat sink is generally located on the bottom side of the printed circuit board.

30. The method of claim 29, wherein mounting includes thermally coupling the heat sink to both the top and bottom heat spreaders.

* * * * *